United States Patent
Im et al.

(10) Patent No.: US 8,968,620 B2
(45) Date of Patent: Mar. 3, 2015

(54) SAFE SEPARATION FOR NANO IMPRINTING

(75) Inventors: Se-Hyuk Im, Austin, TX (US); Mahadevan GanapathiSubramanian, Cedar Park, TX (US); Edward Brian Fletcher, Austin, TX (US); Niyaz Khusnatdinov, Round Rock, TX (US); Gerard M. Schmid, Austin, TX (US); Mario Johannes Meissl, Austin, TX (US); Anshuman Cherala, Austin, TX (US); Frank Y. Xu, Round Rock, TX (US); Byung-Jin Choi, Austin, TX (US); Sidlgata V. Sreenivasan, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 602 days.

(21) Appl. No.: 13/095,514

(22) Filed: Apr. 27, 2011

(65) Prior Publication Data
US 2011/0260361 A1    Oct. 27, 2011

Related U.S. Application Data

(60) Provisional application No. 61/328,353, filed on Apr. 27, 2010.

(51) Int. Cl.
| B29C 45/76 | (2006.01) |
| G03F 7/00 | (2006.01) |
| B82Y 10/00 | (2011.01) |
| B82Y 40/00 | (2011.01) |

(52) U.S. Cl.
CPC .............. *G03F 7/0002* (2013.01); *B29C 45/76* (2013.01); *B82Y 10/00* (2013.01); *B82Y 40/00* (2013.01); *Y10S 977/877* (2013.01)
USPC .......................................... 264/293; 977/877

(58) Field of Classification Search
USPC ........................................ 264/293; 977/887
See application file for complete search history.

(56) References Cited

U.S. PATENT DOCUMENTS

| 6,873,087 | B1 | 3/2005 | Choi et al. |
| 6,909,998 | B2 * | 6/2005 | Hocheng et al. ............... 702/189 |
| 6,932,934 | B2 | 8/2005 | Choi et al. |
| 6,936,194 | B2 | 8/2005 | Watts |
| 7,019,819 | B2 | 3/2006 | Choi et al. |
| 7,077,992 | B2 | 7/2006 | Sreenivasan et al. |
| 7,157,036 | B2 | 1/2007 | Choi et al. |
| 7,179,396 | B2 | 2/2007 | Sreenivasan |
| 7,396,475 | B2 | 7/2008 | Sreenivasan |

(Continued)

FOREIGN PATENT DOCUMENTS

| WO | WO 2004/044651 | 5/2004 |
| WO | WO 2010/047837 | 4/2010 |
| WO | WO 2010/147671 | 12/2010 |

*Primary Examiner* — Jeremiah Smith
(74) *Attorney, Agent, or Firm* — Cameron A. King

(57) ABSTRACT

Control of lateral strain and lateral strain ratio ($d_t/d_b$) between template and substrate through the selection of template and/or substrate thicknesses ($T_t$ and/or $T_b$), control of template and/or substrate back pressure ($P_t$ and/or $P_b$), and/or selection of material stiffness are described.

27 Claims, 3 Drawing Sheets

(56) References Cited

U.S. PATENT DOCUMENTS

| | | |
|---|---|---|
| 7,635,263 B2 | 12/2009 | Cherala et al. |
| 7,635,445 B2 | 12/2009 | Choi et al. |
| 7,636,999 B2 | 12/2009 | Choi et al. |
| 7,701,112 B2 | 4/2010 | Choi et al. |
| 8,087,922 B2 * | 1/2012 | Zhang et al. ............. 425/385 |
| 8,652,393 B2 | 2/2014 | Khusnatdinov et al. |
| 2004/0065252 A1 | 4/2004 | Sreenivasan et al. |
| 2004/0065976 A1 | 4/2004 | Sreenivasan et al. |
| 2005/0145119 A1 * | 7/2005 | Tan et al. ..................... 101/3.1 |
| 2005/0187339 A1 | 8/2005 | Xu et al. |
| 2006/0172553 A1 * | 8/2006 | Choi et al. ..................... 438/780 |
| 2007/0126156 A1 | 6/2007 | Mahadevan et al. |
| 2007/0141191 A1 * | 6/2007 | Kruijt-Stegeman et al. ........................ 425/174.4 |
| 2007/0190200 A1 | 8/2007 | Cherala et al. |
| 2010/0096776 A1 | 4/2010 | Xu et al. |
| 2010/0102469 A1 * | 4/2010 | Khusnatdinov et al. ..... 264/40.1 |
| 2010/0110409 A1 | 5/2010 | Choi et al. |

* cited by examiner ically similar thicknesses and variable back pressure.
SAFE SEPARATION FOR NANO IMPRINTING

CROSS REFERENCE TO RELATED APPLICATIONS

The present application claims priority to U.S. Provisional Application No. 61/328,353 filed Apr. 27, 2010, which is hereby incorporated by reference.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
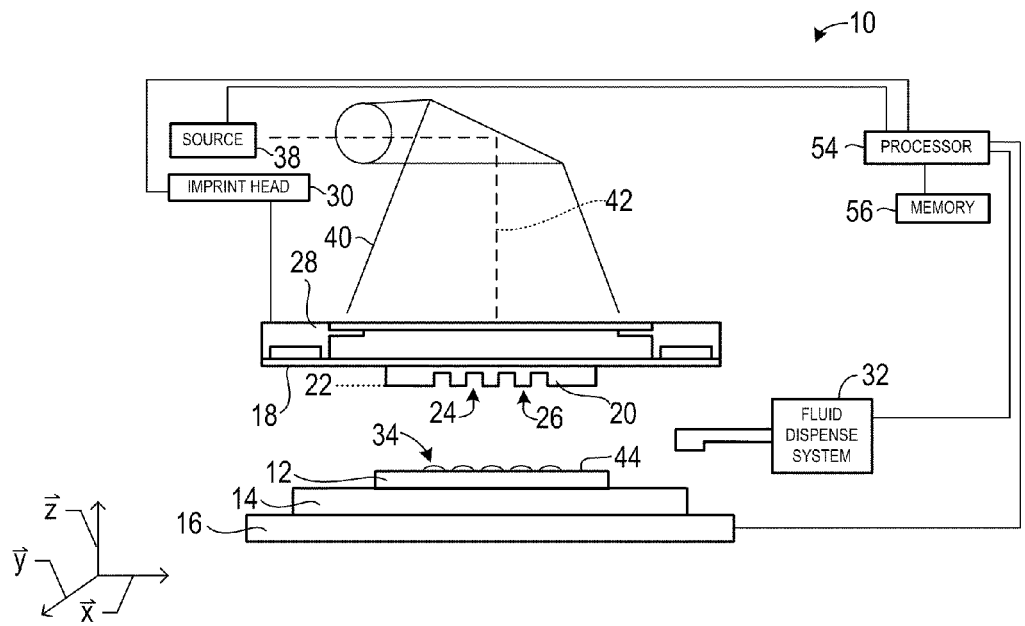
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339; both of which are herein incorporated by reference. Alternatively, formable material 34 may include, but is not limited to, biomaterials (e.g., PEG), solar cell materials (e.g., N-type, P-type materials), and/or the like.

Figure 2:
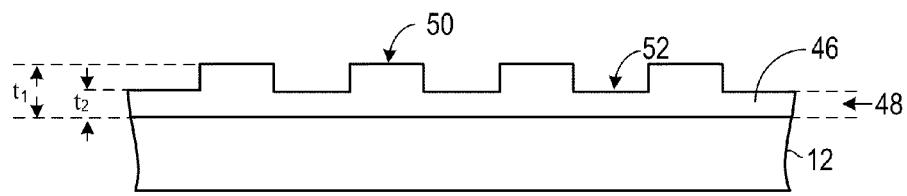
FIG. 2 illustrates a simplified side view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

After formation of patterned layer 46, template 18 or mold 20 and features 50 and 52 of patterned layer 46 may be separated. Generally, the separation effort includes application of force to separate two "plate-like" structures (i.e., template 18 and substrate 12). Separation generally needs to be performed without causing excessive stress and/or strain to template 18 or mold 20 and/or imprinted features 50 and 52 of patterned layer 46. If template 18 and substrate 12 are pulled out in a relatively normal direction (e.g., without a tilting motion), the separation front moves inward (in radial) from a boundary of patterned layer 46. If additional tilting motion is applied, the separation front may move fairly in-parallel lines starting from a remote side from the tilting axis. Exemplary separation front schemes are described in further detail in U.S. Pat. No. 7,701,112, U.S. Patent Publication No. 2010/0096776, U.S. Pat. No. 7,635,445, and U.S. Pat. No. 7,635,263, which are hereby incorporated by reference in their entirety.

Figure 3A:
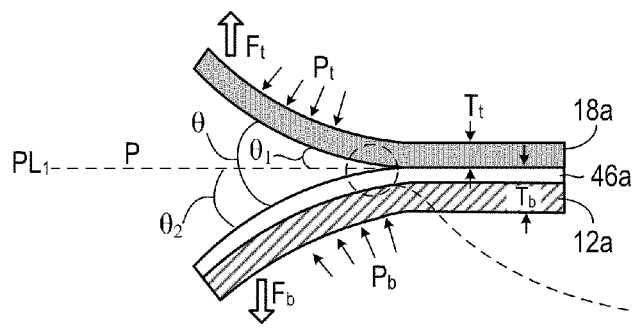
FIGS. 3A-3B illustrate a simplified side view and magnified view of lateral strain (side motion) of a template and a substrate during an imprint lithography separation process.
Figure 3B:
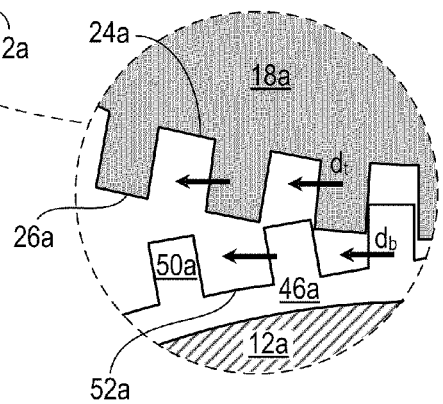

As illustrated in FIG. 3A, template 18a and substrate 12a may form a small angle $\Theta$ at a separation front, which is equal to the sum of the relative bending angles $\Theta_1$ of the template 18a and $\Theta_2$ of the substrate 12a with respect to un-deformed plane $PL_1$. Here, P is the pressure at the gap between the template and substrate outside of the imprinted area, $P_t$ and $P_b$ represent the pressure, if any, applied to the template backside and the substrate backside, respectively. Relative bending angles $\Theta_1$ of the template 18a and $\Theta_2$ of the substrate 12a with respect to un-deformed plane $PL_1$ are functions of multiple variables including, but not limited to, thickness, Young's modulus, pressures, adhesion between template 18a and patterned layer 46, and the like. FIG. 3B shows two lateral motions at the separation front between the template and substrate where $d_t$ is the lateral displacement (or lateral strain) of the template features and $d_b$ is the lateral displacement (or lateral strain) of the imprinted features on the substrate.

Figure 4A:
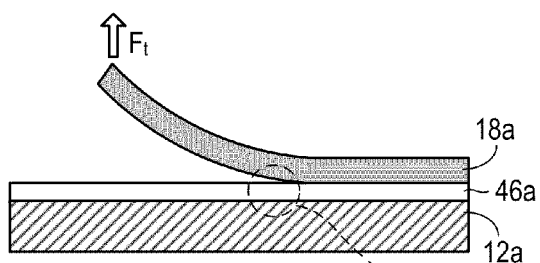
FIGS. 4A-4B illustrate a simplified side view and magnified view of lateral strain (side motion) of a template during an imprint lithography separation process.
Figure 4B:
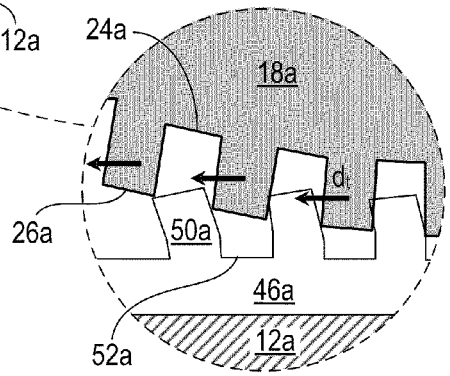

FIG. 4 illustrates strain $d_t$ of template 18a with respect to substrate 12a where it is assumed that the substrate is rigid with no bending at all. Template 18a thus exhibits a lateral strain $d_t$, but the substrate $d_b$ has zero lateral strain. As illustrated, in such a case where the lateral strains are not matched between the template features and the substrate features, imprinted features 50a and 52a will be distorted or fail. In order to prevent the feature failure, it is advantageous to allow the substrate 12a to bend or stretch and its lateral strain $d_b$ to be matched with that of the template ($d_t$).

The bending amounts of the template and substrates are inverse proportional to ($ET^3$), wherein E is Young's modulus of the template or substrate material and T is the template or substrate thickness. Subsequently, the strain is a function of the bending multiplied with the thicknesses (T). Therefore, strain magnitude is inverse proportional to ($ET^2$). Then, the ratio of two lateral strains ($d_t/d_b$) at the interfacing surfaces of template 18a and substrate 12 is proportional to ($E_b T_b^2$)/($E_t T_t^2$).

Figure 5:
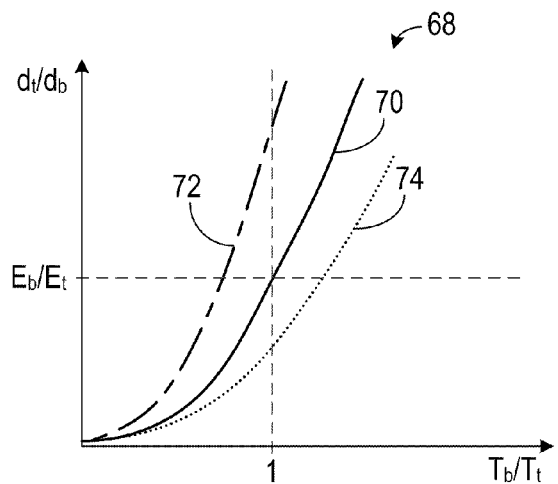
FIG. 5 illustrates a graphical representation of lateral strain ratio of interfacing template and substrate as a function of thickness ratio and back pressure (absolute pressure).
Figure 6:
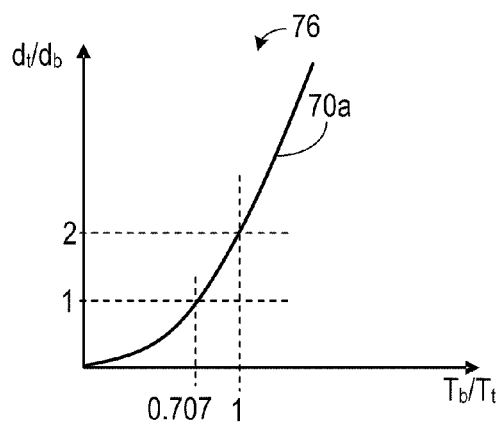
FIG. 6 illustrates a graphical representation of lateral strain ratio of interfacing template and substrate having variable thicknesses and substantially similar back pressure.
Figure 7:
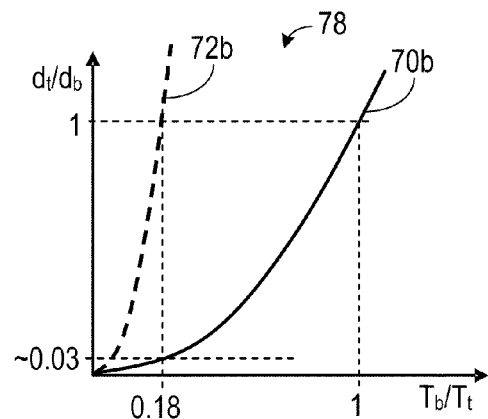
FIG. 7 illustrates a graphical representation of lateral strain ratio of interfacing template and substrate having substantially similar thicknesses and variable back pressure.

FIGS. 5-7 illustrate graphic plots of lateral stain ratio ($d_t/d_b$) in relation to thicknesses of template 18a and substrate 12a ($T_b/T_t$). Generally, solid lines 70-70b represent the strain ratio of template 18a and substrate 12a under substantially similar boundary conditions (e.g., back pressure). Dashed lines 72, 72b and 74 represent template 18a and substrate 12a under substantially different boundary conditions (e.g., back pressure).

FIG. 5 illustrates a graphic plot 68 of lateral strain ratio ($d_t/d_b$) for combinations of thicknesses during separation of template 18a and substrate 12a. For example, under substantially similar boundary conditions (i.e., reference line 70), when thickness of thickness $T_t$ template 18a is significantly less than thickness $T_b$ substrate 12a ($T_t \ll T_b$), separation front may be formed mainly by bending of template 18a. In this example, the ratio of the strain ($d_t/d_b$) is larger than ($E_b/E_t$). Alternatively, having thickness $T_b$ of substrate 12a significantly less than thickness $T_t$ of template 18a ($T_b \ll T_t$), the ratio of the strain ($d_t/d_b$) is smaller than ($E_b/E_t$).

An optimal case may exist wherein strain ratio ($d_t/d_b$) becomes 1 for template 18a and substrate 12a. When the template and the substrate have the same Young's modulus, the optimal configuration is when template 18a and substrate 12a have substantially similar thicknesses $T_t$ and $T_b$ respectively and is under near identical process conditions (e.g., back pressure, constraining boundary conditions). It should be noted that pressure is both positive and negative pressure (vacuum).

Having template 18a and substrate 12 constrained by means of different back supporting (i.e., adjusting the material stiffness) or through the application of back pressure (positive pressure and/or vacuum), however, may significantly influence stress and/or lateral strain. For example, as illustrated in FIG. 5, curves 72 and 74 illustrate lateral strain ratio ($d_t/d_b$) when template 18a and substrate 12a are under different back pressure conditions. Curve 72 represents the relative lateral strain ratio ($d_t/d_b$) when back pressure of substrate 12a is lower (e.g. −30 Kpa) than that of template 18a (e.g. 0 Kpa), and curve 74 represents the opposite case (i.e., where back pressure of substrate 12a is higher than that of template 18a). For example, having only substrate 12a vacuum chucked may influence bending geometry to cause excessive strain during the separation process. Based on the graphical representation, thickness $T_t$ of template 18a may be configured (e.g., increased) greater than thickness $T_b$ of substrate 12a such that bending stiffness of template 18a may be increased in order to compensate for a differences in backside pressure, separation force, and/or template geometry.

Thickness of substrate 12a, however, is generally not a freely selectable variable. For example, semiconductor wafers of 8 inch or 12 inch diameters generally include an industry standard for thickness for substrate 12a. For compensation, thickness $T_t$ of template 18a may be determined based on pre-selected thickness $T_b$ for substrate 12a. Additionally, thickness $T_t$ of template 18a may be determined based on material stiffness (e.g., Young's modulus), back pressure, and the like, such that lateral strain $d_t$ may be minimized or eliminated. Alternatively, back pressure of template 18a can be controlled such that lateral strain ratio ($d_t/d_b$) may be approximately 1.

More specifically, back pressure $P_t$ and/or $P_b$ applied to the template and/or the substrate (see FIG. 3A), can be adjusted in order to modify lateral strain $d_t$ and/or lateral strain $d_b$ to yield a lateral strain ratio ($d_t/d_b$) of approximately 1. The amount and degree of back pressure $P_t$ and/or $P_b$ that is necessary to provide can be predetermined based on the Young's modulus, thickness of the template and substrate, and the separation force to be applied. Control and supply of such back pressure to a template can be provided using chucks and systems described in, for example, U.S. Pat. No. 7,019,819, incorporated herein by reference. Control and supply of such back pressure to a substrate can be provided using chucks and systems described in, for example, U.S. Pat. No. 7,635,263 and U.S. Pat. No. 7,635,445, each of which is incorporated herein by reference.

FIG. 6 illustrates a graphic plot 76 of lateral strain ratio ($d_t/d_b$) for combinations of thicknesses. Graphic plot 76 provides an exemplary method for optimizing lateral strain ratio ($d_t/d_b$) wherein thickness $T_t$ and $T_b$ of either template 18a or substrate 12a is a controllable variable. For example, substrate 12a may be formed of Si having a Young's modulus of approximately 150 GPa, thickness $T_b$ of approximately 0.775 mm. Template 18a may be formed of fused silica having a Young's modulus of approximately 75 GPa. Then, lateral strain ratio ($d_t/d_b$) is a quadratic function passing (0,0) and (1,2). As such, for an ideal lateral strain ratio ($d_t/d_b$) of 1, thickness ratio should be the square root of 0.5 based on $(E_b T_b^2)/(E_t T_t^2)$. Therefore, thickness $T_t$ of template 18a may need to be at approximately 1.1 mm. Substantially identical back pressure may need to be provided to both template 18a and substrate 12a. For example, back pressure may be maintained at approximately −30 Kpa at both template 18a and substrate 12a. A small variation of the back pressures can be optimized based on the separation force to be applied. Alternatively, when template 18a is under ambient pressure, at least a portion of substrate 12a may be under substantially the same back pressure (e.g., ambient) while the remaining portions of substrate 12a are subjected to a different back pressure. Systems and methods for providing differing levels of pressure are further described in U.S. Pat. No. 7,019,819, U.S. Pat. No. 7,635,263 and U.S. Pat. No. 7,635,445, each of which is hereby incorporated by reference in its entirety.

FIG. 7 illustrates a graphic plot 78 of lateral strain ratio ($d_t/d_b$) wherein thicknesses are not controlled variables. Graphic plot 76 provides an exemplary method for optimizing lateral strain ratio ($d_t/d_b$) wherein thickness $T_t$ and $T_b$ of either template 18a or substrate 12a is not a control variable. Material properties of template 18a and substrate 12a may be substantially similar. Thickness $T_t$ and $T_b$ of template 18a and substrate 12a may have a fixed ratio. For example, in one embodiment, the fixed ratio may be set to $T_b/T_t=0.18$. Generally, the "thicker" of template 18a or substrate 12a may need additional support of high back pressure while the "thinner" of template 18a or substrate 12a may need back pressure having a low pressure (e.g., vacuum). For example, for fused silica material, back pressure between approximately 40 Kpa to 90 Kpa may be used for the thicker of template 18a and substrate 12a and back pressure between approximately −40 Kpa to 0 Kpa may be used for the thinner of template 18a and substrate 12a. Actual numbers may be determined using an analytical model and/or finite element analysis. Further, back pressure levels for template 18a and substrate 12a may be adjusted as separation propagates.

Control of lateral strain of template 18a and substrate 12a through the selection of thicknesses $T_t$ and/or $T_b$, control of back pressure, and/or selection of material stiffness may be applied to other separation methods including, but not limited to, those further described in U.S. Pat. No. 7,636,999, U.S. Pat. No. 7,701,112, U.S. Patent Publication No. 2010/0096776, U.S. Pat. No. 7,635,445, and U.S. Pat. No. 7,635,263.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. In a nanoimprint lithography system, a method comprising:
   providing a template in contact with a formed patterned layer on a substrate, the template and the substrate having lateral strains $d_t$ and $d_b$ associated therewith, respectively, when subjected to a separation force;
   determining the difference between the lateral strains $d_t$ and $d_b$ by either (i) measuring the lateral strain values during an initial separation, or (ii) modeling the lateral strain values during a theoretical separation to determine the difference between the $d_t$ and $d_b$ values;
   based on the determined differences, determining the back pressure values which may be applied to the template, the substrate, or both such that the lateral strains $d_t$ and $d_b$ are brought into a matching condition;
   adjusting the lateral strain of the template ($d_t$) or the substrate ($d_b$) or both, while the template remains in contact with the formed patterned layer on the substrate, by applying the determined back pressure or pressures to the template or to the substrate or to both such that the lateral strains $d_t$ and $d_b$ are matched when the template and substrate are subjected to the separation force; and
   applying the separation force to separate the template from the substrate while the determined back pressure or back pressures are applied to the template or to the substrate or both.

2. The method of claim 1 wherein the back pressure is applied prior to applying the separation force.

3. The method of claim 1 wherein the back pressure is applied concurrently with applying the separation force.

4. The method of claim 1 wherein the back pressure is only applied to the template.

5. The method of claim 1 wherein the back pressure is only applied to the substrate.

6. The method of claim 1 wherein the applied back pressure is positive pressure.

7. The method of claim 1 wherein the applied back pressure is negative pressure.

8. The method of claim 1 wherein positive back pressure is applied to the template and negative back pressure is applied to the substrate.

9. The method of claim 1 wherein negative back pressure is applied to the template and positive back pressure is applied to the substrate.

10. An imprint lithography method for separating an imprint lithography template from a patterned layer formed by contacting the imprint lithography template with a formable material deposited on a substrate and solidifying the formable material to form the patterned layer such that the template and the substrate have lateral strains $d_t$ and $d_b$ associated therewith, respectively, when subsequently subjected to a separation force, the method comprising:
   determining the differences between lateral strains $d_t$ and $d_b$ using an analytical model and/or finite element analysis;
   based on the determined differences between lateral strains $d_t$ and $d_b$, determining the amount of back pressure to apply to the template, the substrate, or both, such that the lateral strains dt and db become matched when subjected to the separation force;
   applying the determined amount of back pressure to the template, the substrate, or both while the template remains in contact with the formed patterned layer; and
   applying the separation force to separate the template from the formed patterned layer.

11. The method of claim 10 wherein the back pressure is applied prior to applying the separation force.

12. The method of claim 10 wherein the back pressure is applied concurrently with applying the separation force.

13. The method of claim 10 wherein the back pressure is only applied to the template.

14. The method of claim 10 wherein the back pressure is only applied to the substrate.

15. The method of claim 10 wherein the applied back pressure is positive pressure.

16. The method of claim 10 wherein the applied back pressure is negative pressure.

17. The method of claim 10 wherein positive back pressure is applied to the template and negative back pressure is applied to the substrate.

18. The method of claim 10 wherein negative back pressure is applied to the template and positive back pressure is applied to the substrate.

19. An imprint lithography method for separating an imprint lithography template from a patterned layer formed by contacting the imprint lithography template with a formable material deposited on a substrate and solidifying the formable material to form the patterned layer such that the template and the substrate have lateral strains $d_t$ and $d_b$ associated therewith, respectively, when subsequently subjected to a separation force, the method comprising:
   determining the differences between lateral strains $d_t$ and $d_b$ using an analytical model and/or finite element analysis;
   based on the determined differences between lateral strains $d_t$ and $d_b$, determining the amount of back pressure to apply to the template, the substrate, or both, such that the ratio of lateral strains ($d_t/d_b$) is approximately 1 when subjected to the separation force;
   applying the determined amount of back pressure to the template, the substrate, or both while the template remains in contact with the formed patterned layer; and
   applying the separation force to separate the template from the formed patterned layer.

20. The method of claim 19 wherein the back pressure is applied prior to applying the separation force.

21. The method of claim 19 wherein the back pressure is applied concurrently with applying the separation force.

22. The method of claim 19 wherein the back pressure is only applied to the template.

23. The method of claim 19 wherein the back pressure is only applied to the substrate.

24. The method of claim 19 wherein the applied back pressure is positive pressure.

25. The method of claim 19 wherein the applied back pressure is negative pressure.

26. The method of claim 19 wherein positive back pressure is applied to the template and negative back pressure is applied to the substrate.

27. The method of claim 19 wherein negative back pressure is applied to the template and positive back pressure is applied to the substrate.

* * * * *